United States Patent [19]

Mori et al.

[11] Patent Number: 5,715,592
[45] Date of Patent: Feb. 10, 1998

[54] PARTS DISASSEMBLING APPARATUS

[75] Inventors: Eiichi Mori; Sadahiko Yokoyama; Masatoshi Iji; Yuji Ikuta, all of Tokyo, Japan

[73] Assignee: NEC Corporation, Tokyo, Japan

[21] Appl. No.: 554,159

[22] Filed: Nov. 6, 1995

[30] Foreign Application Priority Data

| Nov. 8, 1994 | [JP] | Japan | 6-273817 |
| Feb. 10, 1995 | [JP] | Japan | 7-023066 |
| Sep. 27, 1995 | [JP] | Japan | 7-249957 |

[51] Int. Cl.⁶ .................................................. B23P 19/04
[52] U.S. Cl. ........................ 29/762; 29/426.3; 29/426.5; 228/191; 228/264
[58] Field of Search ................ 29/426.3, 426.5, 29/762; 219/392; 228/191, 264

[56] References Cited

U.S. PATENT DOCUMENTS

| 3,731,866 | 5/1973 | Mason et al. | 29/762 X |
| 5,174,016 | 12/1992 | Todd | 223/191 X |
| 5,375,318 | 12/1994 | Catalano | 29/762 |
| 5,423,931 | 6/1995 | Inoue et al. | 29/762 X |

FOREIGN PATENT DOCUMENTS

| 79848 | 5/1983 | European Pat. Off. | 29/762 |
| 2418992 | 11/1979 | France | 29/762 |
| 56-37693 | 4/1981 | Japan . | |
| 342895 | 2/1991 | Japan . | |
| 461191 | 2/1992 | Japan . | |
| 5003242 | 1/1993 | Japan | 29/762 |

OTHER PUBLICATIONS

"Surface–Mounted Component Desoldering Tool" IBM Technical Disclosure Bulletin vol. 28, No. 9, Feb. 1986.

Primary Examiner—Peter Vo

[57] ABSTRACT

A printed wiring board, on which an electronic parts are mounted and fixed by way soldering, is introduced into a heating furnace for heating at a temperature higher than or equal to a melting temperature of a solder. After sufficiently melting of solder, an impact force and/or a shearing force are applied. By this under a reduced connecting force, the electronic parts are removed from a printed wiring board. On the other hand, since the parts can be easily removed from the printed wiring board. Also, the parts and the printed circuit are separated for collecting useful substance and can improve resistance to enhance recycling efficiency.

4 Claims, 6 Drawing Sheets

PARTS DISASSEMBLING APPARATUS

BACKGROUND OF THE INVENTION

1. Field of the Invention

The present invention relates generally to a parts disassembling method and a parts disassembling apparatus for disassembling a printed wiring board mounting electronic parts by removing the electronic parts from the board and thus separating the electronic parts and the printed wiring board.

2. Description of the Related Art

In the prior art, as a method for disassembling a printed wiring board mounting electronic parts (hereinafter referred to as "parts mounting printed wiring board") by removing the electronic parts from the printed wiring board, there are a method to remove the parts from the printed wiring board by gripping the same with a tweezer or so forth after melting solder fixing the parts on the printed wiring board or a method to automatically select specific parts and removing the selected parts by means of an arm type robot or so forth after melding the solder. These disassembling methods are intended to replace faulty parts with normal parts and thus have been called as parts repair method in a quality control process of the parts mounting printed wiring board.

Figure 1:
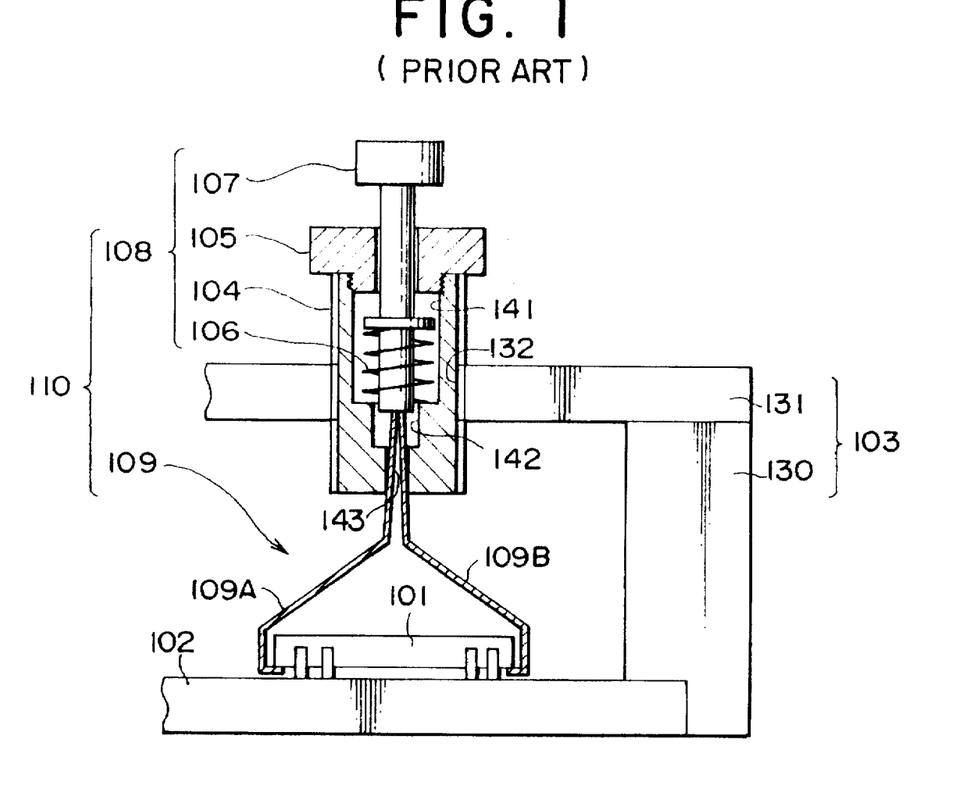
FIG. 1 is a section of a parts disassembling jig for a parts mounting printing circuit board.

As an apparatus for removing parts from the parts mounting printing circuit board, Japanese Unexamined Patent Publication (Kokai) No. Heisei 3-42895 discloses a "leading wire parts repairing jig". FIG. 1 is a section of the leading wire parts repairing jig disclosed in the above-identified publication. As shown in FIG. 1 the leading wire parts repairing jig generally comprises a parts removing member 110 and a frame 103 supporting the parts removing member. The frame 103 is in a channel shafted configuration opening downwardly and holds a board 102 by a plurality of side plates 130 at upper side and circumferential side portions. Also, on the board 102 and a support plate 131 of the frame 103 held horizontally, a plurality of threaded bores 132 are provided. To these threaded bores 132, a tension adjusting body 108 of the parts removing member 110 is engaged.

The tension adjusting body 108 includes a cylindrical adjusting body 104 formed thread on the outer periphery defining variable diameter bore having large diameter portion 141, an intermediate diameter portion 142 and a small diameter portion 143. The tension adjusting body 108 also includes a cylindrical operating body 107 provided with an elastic member 106 at the tip end thereof and inserted within the adjusting body 104 in a portion of more than half length thereof, and a lid portion 105 buried at the inner upper end of the adjusting body 104 and having a through opening extending through the operating body for restricting motion stroke of the operating body 107.

On the other hand, at the tip end of the operating body 107, a gripper body 109 including gripping bodies 109A and 109B both being formed of an elastic material and into substantially L-shaped configuration at the lower end thereof to form essentially triangular roof shaped configuration to grip the parts 101 from both side, is provided.

The leading wire parts repairing jig constructed as set forth above removes the leading wire parts 101 from the printed wiring board in the following manner. Initially, after holding the both end portions of the printed wiring board 102 with the side plates 130 of the frame 103, the operating body 107 of the tension adjusting body 108 in the parts removing member 110 which is placed above the parts 101 to be removed, is moved downwardly against the elastic force of the elastic body 106. By this, the lower end portion of the operating body 107 passes through the intermediate diameter portion 142 and approaches the upper end portion of the small diameter portion 143 of the tension adjusting body 108. Then, the gripping bodies 109A and 109B are moved downwardly. At this time, the upper portion of the gripping bodies 109A and 109B which are initially held to be generally in parallel before the operating body 107 is depressed downwardly, are opened. Associating therewith, the lower portion of the gripper body 109 opened in the width permitting gripping of the parts 101.

When the downward force exerted on the operating body 107 is released, the operating body 107 is elastically pushed upwardly by the elastic body 106. Associating therewith, the gripper body 109 is moved upwardly to make the angle formed by the gripper bodies 109A and 109B smaller by restriction of the smaller diameter portion 143 within the tension adjusting body 108. Thus, the gap at the lower portion of the gripper body 109 is narrowed to firmly grip the sides of the parts 101. However, since the parts 101 are fixed on the printed wiring board 102 by soldering, the stroke where the operating body 107 is elastically moved up is limited. After the limited stroke, the operating body 107 stops. At this time, by the elastic member 106, upward tension is exerted on the parts 101. It should be noted that the tension to be exerted on the parts 101 can be adjusted by rotating the tension adjusting body 108 to shift vertically.

In conjunction with gripping of the leading wire parts 101 mounted on the printed wiring board 102 with the parts removing member 110 and exerting the tension on the parts, the printed wiring board 102 and the leading wire parts repairing jig are placed in a heating furnace. When the temperature of the heating furnace is elevated to the melting temperature of the solder, the solders fixing the leading wire parts 101 on the printed wiring board 102 are melted at substantially the same timing. Then, the upward tensile force exerted on the leading wire parts 101 allows the leading wire parts 101 to be disassembled from the printed wiring board 102.

Gold and iron are used for parts for the parts mounting printing circuit board, and the printed wiring board irregularly contain useful substances, such as copper and glass fibers. In the case where the parts mounting printing circuit board is to be recycled, therefore, the removal of the mounted parts from the printed wiring board to separate the electronic parts from the printed wiring board for collection is essential to efficiently perform the later recycling to collect the electronic parts and useful substances on the printed wiring board and improve the purity of the composition of the collected materials.

However, in the conventional disassembling method for removing the electronic parts from the printed wiring board by means of tweezers, since it is intended to replace the faulty parts, it is not possible to efficiently disassemble all of the parts on the printed wiring board simultaneously. Also, the disassembling method by means of the robot, is effective in the case where the particular parts mounted on the printed wiring board. Therefore, it is not possible to disassembly all of the parts on the wind variety of parts mounting printing circuit board being to be disposed.

On the other hand, even in the repair jig, while it is effective in the case where the parts mounted on the printed wiring board are processed in one-by-one basis but is not possible to disassemble all of the parts mounted on the printed wiring board at one time and requires long period for disassembling all parts. In addition, in order to remove the all of the parts on the printed wiring board, it becomes necessary to prepare a large number of repair jigs respectively adapted to the external configuration of respective parts.

SUMMARY OF THE INVENTION

It is an object of the present invention to provide a parts disassembling method and a parts disassembling apparatus for a parts mounting printing circuit board, which can easily and efficiently remove electronic parts from a printed wiring board mounting a wide variety of electronic parts.

In accordance with the first aspect of the invention, a parts disassembling method for a parts mounting printing circuit board for removing electronic parts mounted on a printed wiring board by soldering, comprises:

a heating step of heating the printed wiring board for melting the solder; and a removing step of exerting an external force onto at least on of a parts mounting surface, a backside surface at the opposite side to the parts mounting surface or a side edge of the printed wiring board, in which the solder is melted to remove the parts from the printed wiring board.

In the case set forth above, the external force to be exerted in the removal process is an impact force, a vibration force or a shearing force for scraping off the parts by sweeping the parts mounting surface.

In accordance with the second aspect, a parts disassembling apparatus comprises:

a heating furnace for heating a printed wiring board with parts mounted thereon by solder, to a temperature equal to or higher than a melting temperature of solder;

a printed wiring board carrier for holding the printed wiring board mounting parts fixed by soldering; and a parts disassembling member exerting external force on the printed wiring board.

In accordance with the third aspect, a parts disassembling apparatus comprises:

a heating furnace for heating a printed wiring board with parts mounted thereon by solder, to a temperature equal to or higher than a melting temperature of solder;

a plurality of printed wiring board carriers for holding outer circumferential edge portions of a printed wiring board mounting parts fixed by a soldering;

feeding means for connecting a plurality of the printed wiring board carriers each other and sequentially introducing the printed wiring board carriers into the heating furnace;

a parts disassembling member exerting external force on the printed wiring board;

a primary fixing portion opening and closing mechanism for making the printed wiring board carriers to grip the outer circumference of the printed wiring board before feeding of the printed wiring board carriers into the heating furnace; and a secondary fixing portion opening and closing mechanism for releasing gripping of the printed wiring board by the printed wiring board carriers fed out of the heating furnace.

Preferably, a portion of the parts disassembling member, which applies the external force onto the printed wiring board, may be repeatedly collided on the surface of the printed wiring board. Also, a portion which applies the external force may exert a shearing force between the parts and the printed wiring board by scraping a parts mounting surface of the printed wiring board.

A plurality of the external force applying portions may be provided on the outer peripheral surface of the rotary body.

As set forth above, the printed wiring board mounting electronic parts by soldering, is introduced into the heating furnace. After elevating the temperature at the predetermined temperature, an external force, such as the impact force, the vibration force and/or the shearing force, is applied to the printed wiring board. By this, most of the electronic parts are removed at one timing.

The parts and the printed wiring board as disassembled are active for maintaining an original condition, and permits recycling of the useful material.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiment of the invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

In a parts disassembling method for a parts mounting printing circuit board according to the present invention, at first, a printed wiring board is heated in a heating furnace for melting a solder. As a method for heating, a method for heating the printed wiring board by taking an infrared ray heater as a heat source, a method for heating with a hot air as a heat source, a method for heating with taking an eddy current induced by a high frequency as a heat source and so forth may be employed. Amongst, the method of heating by means of the infrared ray heater is most preferred.

A temperature for heating the printed wiring board is required to be set at a higher temperature than a melting temperature of the solder for satisfactorily melting the solder. In the normal parts mounting printing circuit board, the heating temperature of the printed wiring board is preferred to be 190° C. to 250° C.

In a parts removing process after heating of the parts mounting printing circuit board, an external force, such as an impact force, a vibration force or shearing force, is applied onto at least one of the parts mounting surface, a backside surface opposite to the parts mounting surface or a side surface. By application of the external force in the manner set out below, from the printed wiring board, in which fixing force by the solder is lowered by heating, most of the parts soldered on the printed wiring board can be removed at one action. It should be noted that the external force, such as the impact force, the vibration force or shearing force and so forth, may be exerted not only solely but also in combination in alternating manner.

On the other hand, in order to maximize transmission of the external force exerted on the printed wiring board, it is preferred to apply the external force in perpendicular direction or parallel direction with respect to the parts mounting surface of the printed wiring board. As a method for applying the external force, in case of application of the impact force, the parts mounting printing circuit board is subject to free fall or hitting the parts mounting surface thereof or so forth by means of a rotary vane, hummer or so forth. On the other hand, in case of application of the shearing force, the parts mounting surface of the printed wiring board is swept by means of a metal plate, brush or so forth to scrape off the parts.

It should be noted that the parts removing process from the parts mounting printing circuit board is required to be performed as quick as possible after melting of the solder through the heating process. However, since the parts removing process is required to be performed before resolidifying of the solder, by incorporating the removing process, such as free fall of the printed wiring board in the heating process, it becomes possible to more efficiently disassemble the printed wiring board.

Next, concrete discussion with respect to a result of test employing the preferred embodiment of the parts disassembling method for the parts mounting printing circuit board, according to the present invention.

As a printed wiring board, a board prepared by forming wiring patter of copper film on a glass fiber reinforced epoxy resin substrate, was employed. On the printed wiring board, a plurality of electronic parts were soldered for forming a sample.

It should be noted that electronic parts as generally referred to are IC, resistor, capacitor, diode, connector, transformer and other parts forming electric circuit. There are two types of electronic parts. Namely, one type of the electronic parts passes a lead wire through a through hole defined in the printed wiring board and is fixed on the printed wiring board by soldering the lead wire (hereinafter referred to as "through hole type parts"), and the other type of the electronic parts does not uses the through hole in the printed wiring board and is directly soldered on the surface of the printed wiring board (hereinafter referred to as "surface mounting type parts"). The present invention is applicable for both types of parts.

On the other hand, the solder has a property to melt at a temperature higher than a specific temperature and means a solder for electronic industry, which fixes the electronic parts on the printed wiring board and, in conjunction therewith, establishes electrical connection between the electronic parts and the circuit pattern on the printed wiring board. Typically, as the solder for the electronic industry, Sn—Pb type alloy is employed. However, the present invention is equally applicable for the solder other than the alloy type, such as the Sn—Pb type alloy. Also, the present invention would be effective even for the case where a resin composition or inorganic composition which can be melted or decomposed as heated to a temperature higher than a specific temperature is employed for bonding or adhering the electronic parts onto the printed wiring board.

For the electronic parts in the shown embodiment, as example of the through hole type parts, such as PGA (pin grid array package) having 240 lead pins, DIP (dual in-line package) having 16 lead pins and a resistor having two lead pins are employed. On the other hand, as examples of the surface mounting type parts, QFP (quad flat package) having 64 lead pins, a chip capacitor, a chip resistor and so forth are employed. The number of parts employed in the sample are 30 in both of the through hole type parts and the surface mounting type parts. Therefore, in the shown example, 60 electronic parts were mounted on the printed wiring board. It should be noted that the composition of the solder used in the example is Sn: 60% by weight and Pb: 40% by weight.

With employing the parts mounting printing circuit board as set forth above, the following examples Nos. 1 to 5 and comparative examples Nos. 1 to 3 are processed.

In the examples Nos. 1 to 5, after heating the parts mounting printing circuit board were heated, removal process of the parts was performed. In the heating process, the infrared ray heater was employed as a heating device to melt the solder by heating at 210° C. for 3 minutes.

In the removing process of the example No. 1, the parts mounting printing circuit board is subjected to free fall over 1 m with orienting the parts mounting surface perpendicular to the falling direction. Subsequently, the parts mounting surface was swept by a stainless plate to apply shearing force on respective parts.

In the removing process of the example No. 2, under the same condition to the foregoing example No. 1, only free fall of the parts mounting printing circuit board was performed.

In the removing process of the example No. 3, sweeping of the parts mounting surface by means of the stainless plate was performed to apply the shearing force for respective parts.

In the removing process of the example No. 4, an impact force was exerted on the backside surface opposite to the parts mounting surface in the parts mounting printing circuit board by means of the rotary vane in a direction perpendicular to the surface. Subsequently sweeping of the parts mounting surface by means of the stainless plate was performed for exerting shearing force for respective parts. In the shown example, the rotary vane was constructed by providing four vanes of stainless plate in a size of 5 cm in height, 5 cm in width and 0.5 cm in thickness on the outer periphery of a cylindrical rotary body. Also, at this time, the rotation speed of the rotary vane was 300 r.p.m. to apply the impact force on the printed wiring board for 5 seconds.

In the removing process of the example No. 5, an impact force was exerted on the side edge of the parts mounting surface in the parts mounting printing circuit board by means of the hummer in the perpendicular direction to the side edge. Subsequently, by means of the stainless plate, the parts mounting surface was swept to apply the shearing force on respective parts. As the hummer used at this time, a Charpy impact tester was used with 2.2 kg of a hummer weight and 36 cm of distance from a center axis of rotation of the hummer to an impact point, and 45° of lifting angle of the hummer.

In the comparative example No. 1, after heating the parts mounting printing circuit board by means of the infrared ray heater at 210° C. for 3 minutes, the printed wiring board is held with orienting the parts mounting surface downwardly, for 30 seconds.

In the comparative example No. 2, without heating the parts mounting printing circuit board, free fall of the printed wiring board is performed to exert the impact force.

In the comparative example No. 3, without heating the parts mounting printing circuit board, sweeping of the parts mounting surface by means of the stainless plate is effected to apply the shearing force to respective parts.

Results of the test performed under the conditions set forth above with respect to the examples Nos. 1 to 5 and the comparative examples Nos. 1 to 3 are shown in the following table 1. It should be noted that a disassembling rate shown in the following table 1 is a rate of the number of parts removed from the printed wiring board after resting versus the total number of the parts mounted on the parts mounting printing circuit board.

TABLE 1

| | EXAMPLE | | | | | COMPARATIVE | | |
|---|---|---|---|---|---|---|---|---|
| | 1 | 2 | 3 | 4 | 5 | 1 | 2 | 3 |
| DISASSEMBLING RATE (%) OF THROUGH HOLE TYPE PARTS | 100 | 90 | 80 | 100 | 90 | 10 | 0 | 0 |
| DISASSEMBLING RATE (%) OF SURFACE MOUNTING TYPE PARTS | 100 | 60 | 90 | 100 | 90 | 20 | 0 | 0 |
| DISASSEMBLING RATE (%) OF OVERALL PARTS | 100 | 75 | 85 | 100 | 90 | 15 | 0 | 0 |

As can be appreciated from the foregoing table 1, in case of only heating as in the comparative example No. 1 or in case of only parts removing process, disassembling rate of the parts is quite low. In contrast to this, when both of the heating process for the parts mounting printing circuit board and parts removing process as set forth above are performed, the disassembling rate higher than or equal to 75% can be achieved. Therefore, it should be appreciated that for disassembling the parts from the parts mounting printing circuit board, it is essential to perform both of the heating process and removing process.

On the other hand, while the external force exerted on respective parts in the removing steps in the examples Nos. 1, 4 and 5 are combination of the impact force and the shearing force, the example No. 2 exerts only impact force and the example No. 3 exerts only shearing force. As can be seen from the results of testing in the foregoing table 1, it should be clear that, in order to efficiently disassemble the parts from the printed wiring board, it is preferred to apply the external force as a combination of the impact force and the shearing force as in the examples Nos. 1, 4 and 5.

Figure 2:
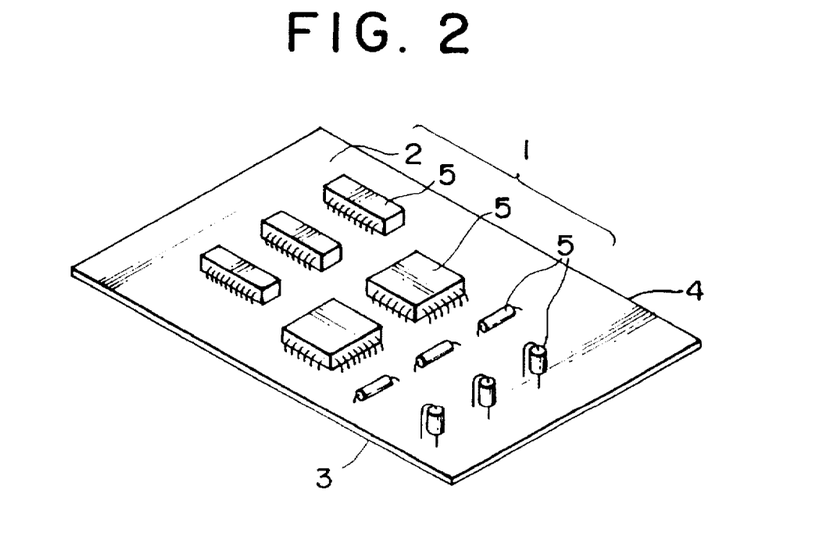
FIG. 2 is a perspective view showing a parts mounting printing circuit board.
Figure 3:
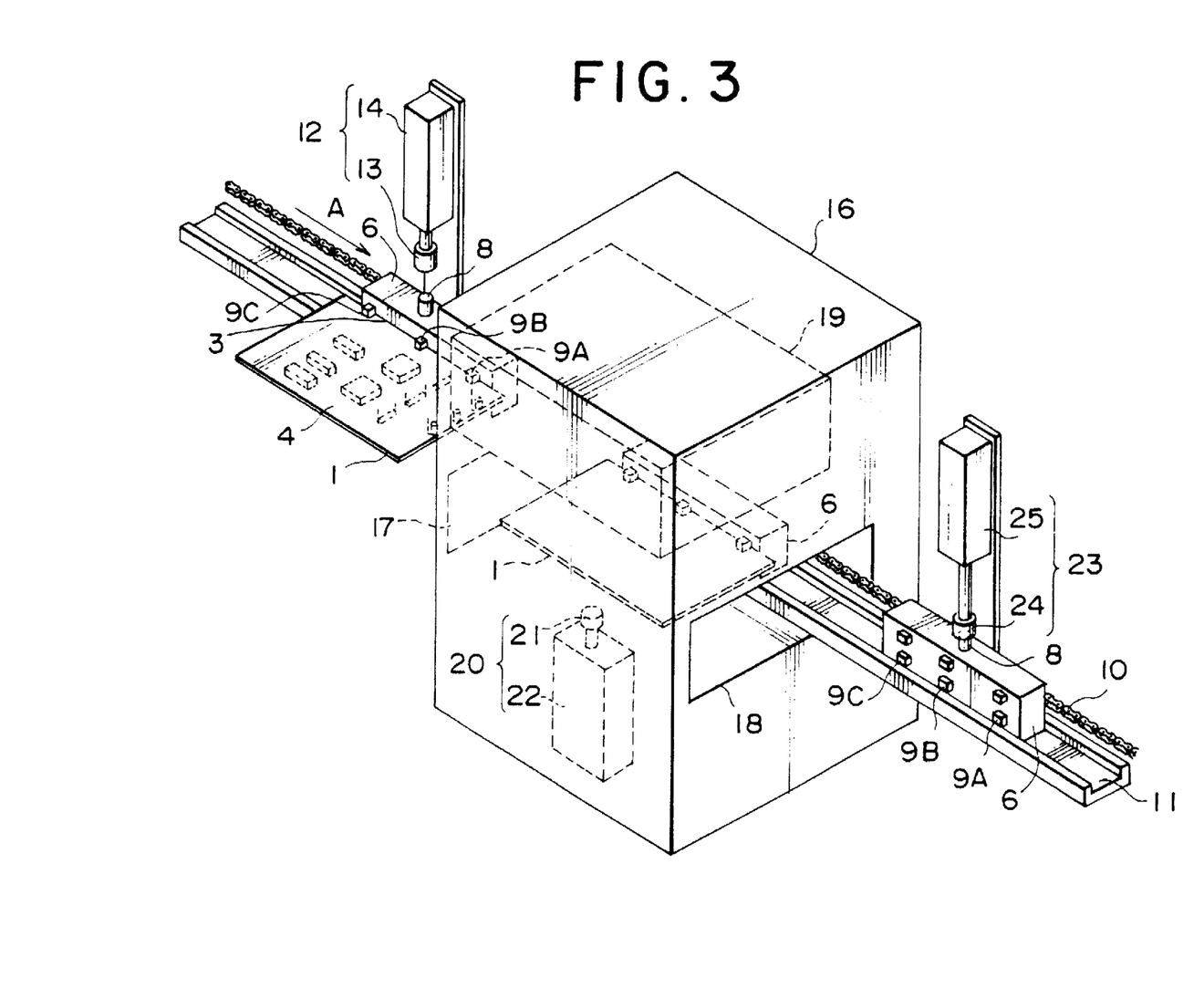
FIG. 3 is a perspective view of the preferred embodiment of a parts disassembling apparatus according to the present invention, for a parts mounting printing circuit board.

Next, a parts disassembling apparatus for the parts mounting printing circuit board, according to preferred embodiment of the present invention will be discussed with reference to the drawings, particularly to FIGS. 2 and 3. FIG. 2 is a perspective view showing a parts mounting printing circuit board, and FIG. 3 is a perspective view of the parts disassembling apparatus for the parts mounting printing circuit board, according to the present embodiment. According to the present embodiment, parts are removed by an impact force.

On a printed wiring board 2 illustrated in FIG. 2, a plurality of electronic parts 5 are mounted for forming the parts mounting printing circuit board. The parts mounting printing circuit board is disassembled by means of a parts disassembling apparatus illustrated in FIG. 3.

The parts disassembling apparatus as shown in FIG. 3 includes a heating furnace 16 in a tunnel furnace structure for heating the parts with maintaining the parts mounting printing circuit board 1. At the upper portion in the interior of the heating furnace 16, an infrared ray heater 19 is provided. By means of this infrared ray heater 19, the temperature with the heating furnace 16 is elevated.

In the heating furnace 16, a feeding device 10 for transporting a plurality of printed wiring board carriers gripping the parts mounting printing circuit board 1 are provided through the heating furnace along a rail 11, is provided through the heating furnace 16. The feeding device 10 comprises an endless chain or belt formed of a material having sufficient heat resistance, and a feeder driving device driving the chain or so forth. A plurality of wiring board carrier 6 is connected to the chain or so forth.

On the other hand, within the heating furnace 16, a parts disassembling member 20 which sequentially applies the mechanical external force on the outer periphery portion 4 of the parts mounting printing circuit board 1. The parts disassembling member 20 includes a hitting head 21 providing direct impact force by directly contacting on the circumferential edge portion of the parts mounting printing circuit board 1, and a hitting head driving portion 22 for reciprocating vertically at high speed.

Also, at the inlet side of the heating furnace 16, a fixing portions 9A and 9B of a chuck structure in the printed wiring board carrier 6, a primary fixing portion operating mechanism 12 for opening and closing the hit head is provided. On the other hand, at the outlet side of the heating furnace 16, a secondary fixing portion 23 having a function similar to the primary printed wiring board carrier 6, is provided. These first and second fixing portion operating mechanisms 12 and 23 are constructed with opening and closing head driving portions 14 and 25 for moving a opening and closing heads toward and away in the vertical direction. It should be noted that when the fixed portion operating button 8 is depressed, the fixing portions 9A, 9B and 9C become opened condition (hereinafter referred to as "open" condition). On the other hand, when the depression force on the opening and closing heads 13 and 24 is released, the fixing portions 9A, 9B and 9C are placed in the closed position (hereinafter referred to as "closed" condition.

With the parts disassembling apparatus for the parts mounting printing circuit board, constructed as set forth above, the manner of disassembling of the parts on the parts mounting printing circuit board will be discussed hereinafter.

By the feeding device 10, the printed wiring board carrier 6 which sequentially feeds the printed wiring boards at a speed of approximately 1 m per minutes in the direction shown by arrow A is stopped at the first fixing portion operating mechanism 12. Then, the opening and closing head 13 of the primary fixing portion operating mechanism 12 is advanced downwardly to depress the operating button 8 provided on the printed wiring board carrier 6. Then, the fixed portions 9A, 9B and 9C become the "open" condition. Then the fixing portions 9A, 9B and 9C are inserted into the outer peripheral portion 3 of the parts mounting printing circuit board 1. Subsequently, the opening and closing head 13 of the primary fixed portion operating mechanism 12 is retracted upwardly to place the fixing portions 9A, 9B and 9C at the "closed" condition. Then, the fixing portions 9A, 9B and 9C grip the parts mounting printing circuit board 1. At this time, the gripping force of the fixing portions 9A, 9B and 9C is in the magnitude, at which the parts mounting printing circuit board 1 may not be loosed out from the fixing portion even when the external force is exerted on the parts disassembling member 20. Also, while the parts mounting printing circuit board 1 is illustrated to grip the parts in the horizontal direction, the present invention is not specified to the construction where the parts mounting printing circuit board 1 in the shown orientation. Also, in order to improve the disassembling rate, the parts mounting printing circuit board 1 is gripped with orientating the parts mounting surface downwardly.

Subsequently, the printed wiring board carrier 6 gripping the parts mounting printing circuit board 1 is transported by the feeding device 10 into the heating furnace 16 via an inlet window 17 of the heating furnace 16. Then, the printed wiring board carrier 6 is stopped at the position over the parts disassembling member 20 provided within the heating furnace 16. Within the heating furnace 16, the furnace temperature is controlled to be in a range of 190° C. to 250° C. by the infrared ray heater 19. The parts mounting printing circuit board 1 is held without exerting the external force until the solder on the surface is melted. The holding period is preliminarily set as a period required for sufficiently melting the solder.

Then, after expiration of the set period, the parts disassembling member 20 is operated to repeatedly exerts impact on the outer circumference 4 of the parts mounting printing circuit board 1. By this, since the impact force is exerted on the parts mounting surface of the parts mounting printing circuit board 1, the bonding force of the solder is lowered so that each electronic parts are easily released from the printed wiring board 1 to fall down. It should be noted that the period required for this process is approximately several tens seconds. By applying the impact force in the extent of 1 G for several ten times, the most of the electronic parts 5 are loosen off from the printed wiring board 1.

After removing respective electronic parts 5 from the parts mounting printing circuit board 1 within the heating furnace 16, the printed wiring board carrier 6 gripping the printed wiring boards 2 is moved in the direction of the arrow A. Then, the printed wiring board carrier 6 is transported out of the heating furnace 16 via an outlet window 18 of the furnace 16. And, the printed wiring board carrier 6 is stopped at the position where the secondary fixed portion operating mechanism 23 is present. The opening and closing head 24 of the secondary fixed portion operating mechanism 23 is advanced downwardly to depress the fixed member opening and closing button 8. Then, the fixing portions 9A, 9B and 9C of the printed wiring board carrier 6 becomes the "open" condition to remove to permit removal of the printed wiring board 2 from the printed wiring board carrier 6.

Thus, since the electronic parts 5 are removed from the parts mounting printing circuit board 1 and the electronic parts 5 and the printed wiring boards 2 are separately corrected to improve efficiency in recycling the resource.

Figure 4:
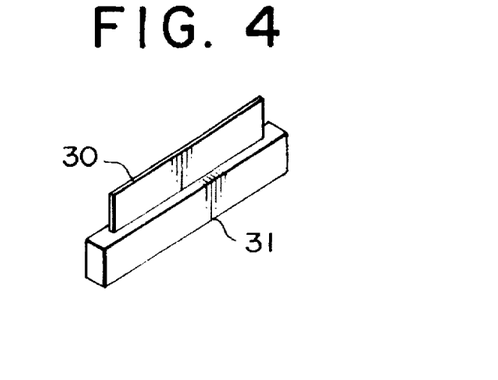
FIG. 4 is a perspective view showing a hit head in a parts disassembling member.
Figure 5:
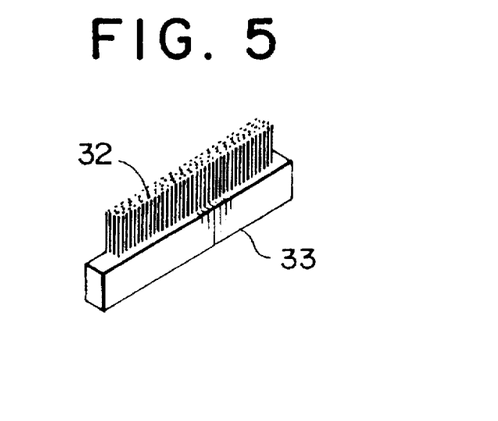
FIG. 5 is a perspective view of another hit head in a parts disassembling member.

Next, explanation will be given for another parts dissembling member other than the parts disassembling member of FIG. 3. FIGS. 4 and 5 are perspective views showing hitting heads in the parts disassembling member. The hitting head shown in FIG. 4 is a plate 30 fixed on a holder 31. On the other hand, the hitting head shown in FIG. 5 is a brush 32 mounted on a holder 33. These hitting heads are mounted on the hitting head driving portion 22 in place of the cylindrical hitting head 21 of FIG. 3, to form the parts disassembling member 20.

In this case, the tip end of the plate 30 or the brush 32 is repeatedly collided onto the outer peripheral edge of the printed wiring board 1. Also, it is advantageous for further improving the disassembling rate of the parts by employing a head driving portion which can shift the hitting head in parallel to the parts mounting surface of the parts mounting printing circuit board 1 in place of the hitting head driving portion 22. Namely, by moving the plate 30 or the brush 32 with contacting the tip end on the parts mounting surface to exert the shearing force on respective electronic parts, the electronic parts 5 can be easily removed from the parts mounting printing circuit board 1.

Figure 6:
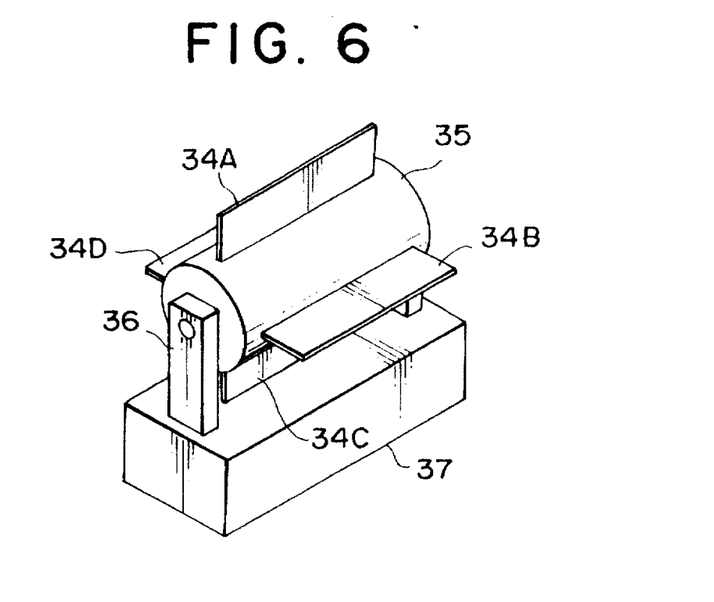
FIG. 6 is a perspective view showing a parts disassembling member having a rotary body.
Figure 7:
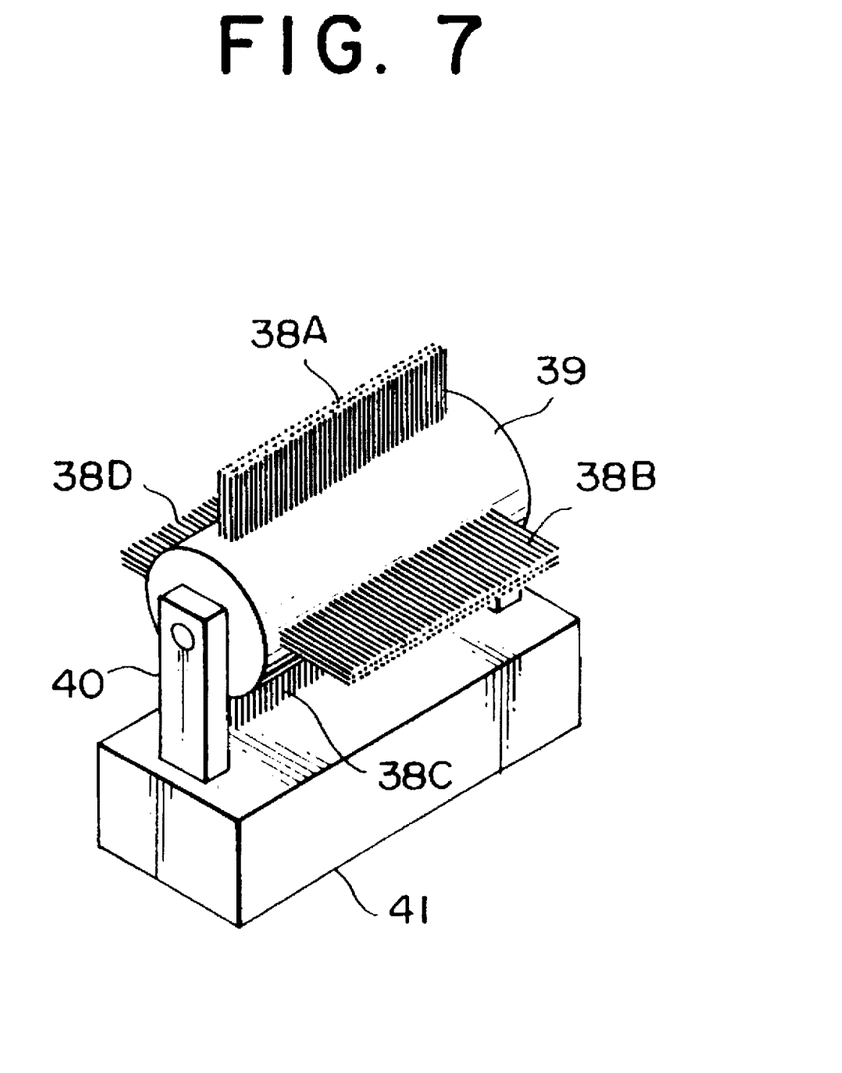
FIG. 7 is a perspective view showing another parts disassembling member having a rotary body.

On the other hand, as the parts disassembling member, a rotary driving device having the cylindrical rotary body 35 or 39 as shown in FIGS. 6 and 7, carrying the hitting head shown in FIGS. 4 and 5 may also be employed. Namely, the parts disassembling member shown in FIG. 6 has a plurality of plates 34A, 34B, 34C and 34D mounted on the outer periphery of the rotary body 35 is provided on a head rotatingly driving device 37. On the other hand, the parts disassembling member shown in FIG. 7 is constructed by mounting a plurality of brushes 38A, 38B, 38C and 38D on the outer periphery of the rotary body 39 provided on a head rotatingly driving device 41.

These parts disassembling members are placed at the lower part of the heating furnace 16 similarly to the parts disassembling member 20 and thus repeatedly contacting the tip ends of the plates 34A to 34D or the brushes 38A to 38D by rotating the rotary body 35 or 39 to repeatedly exert the impact.

Also, the parts disassembling member may also be shifted in parallel to the parts mounting surface in conjunction with rotating of the rotary bodies 35 or 39 by employing the head rotatingly driving device which can permit shifting of the plate or blade in parallel to the parts mounting surface. In this case, the tip ends of the plates 34A to 34D or the brushes 38A to 38D carried on the rotary body 35 or 39 are head in contact with the parts mounting surface of the parts mounting printing circuit board 1 to apply the shearing force. This arrangement clearly improve the parts disassembling rate.

Furthermore, it is also possible to provide the plate 30 or the brush 32 of the hitting head shown in FIGS. 4 and 5 so as to contact with the parts mounting surface of the parts mounting printing circuit board 1 in the heating furnace 16. Then, by shifting the printed wiring board carrier 6 with the feeding device 10, the plate 30 or the brush 32 sweeps the parts mounting surface to exert a shearing force on the electronic parts 5.

On the other hand, in case that the electronic parts 5 are mounted on both side surfaces of the printed wiring board 2, a mechanism for reversing the parts mounting printing circuit board 1 is added to the printed wiring board Carrier 6 or so forth to reverse the parts mounting printing circuit board 1 every time of application of the impact force to equally provide the impact for opposite surfaces.

As set forth above, the present invention may be constructed with employing a single parts disassembling member or a plurality of parts disassembling members in combination. Also, by exerting the external force as combination for the impact force and the shearing force on the parts mounting printing circuit board 1, parts disassembling rate can be further improved.

It should be noted that the present invention can also be constructed by preliminarily placing the printed wiring board carrier within the heating furnace 16 so that the operator may load and unload the parts mounting printed wiring board 1 to the printed wiring board carrier 6. In this case, without employing the feeding device 10, the rail 11, the first and second fixed portion operating mechanism 12 and 23, the parts disassembling device can be constructed.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

Figure 8:
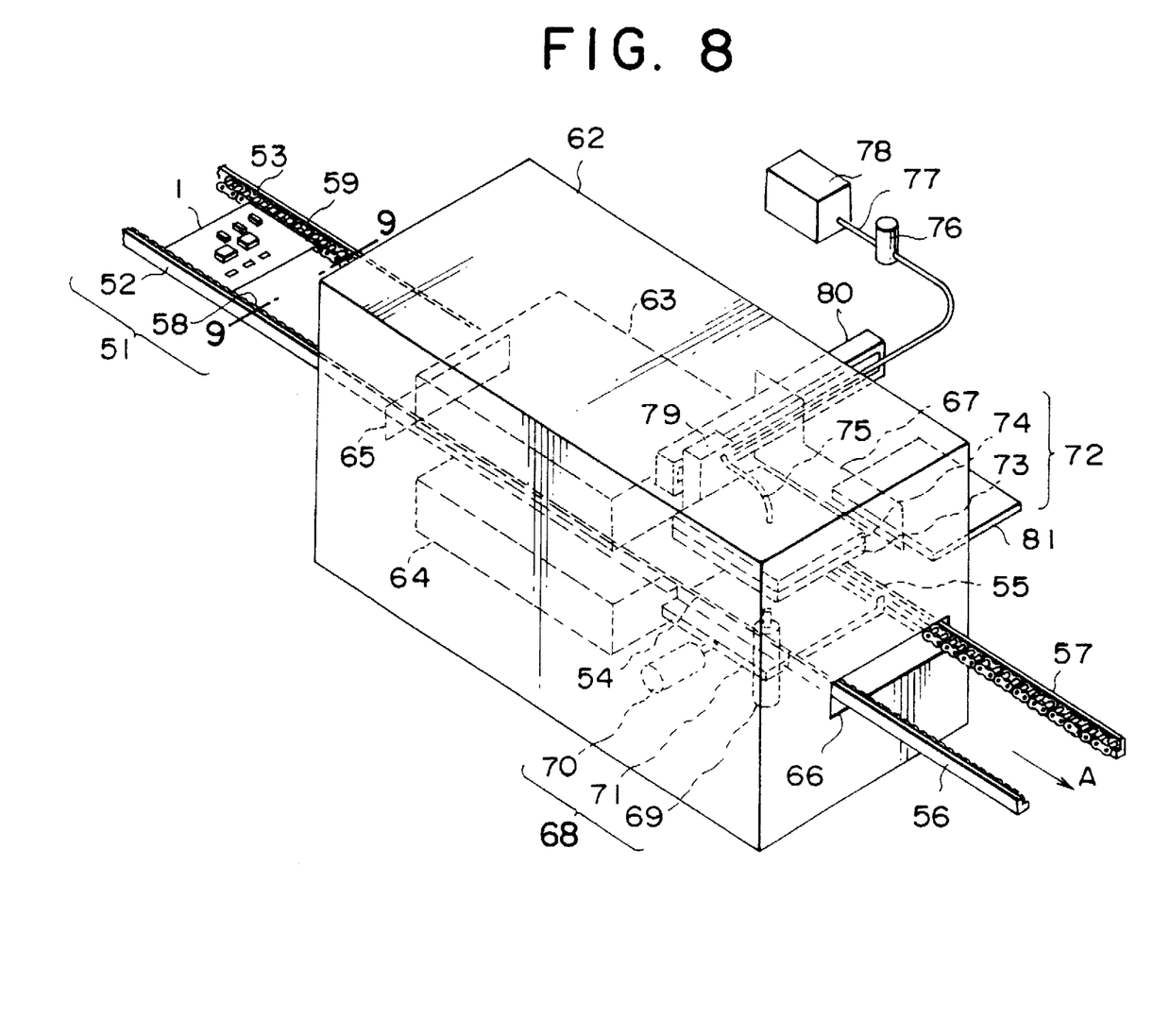
FIG. 8 is a perspective view of another embodiment of a parts disassembling apparatus according to the present invention, for a parts mounting printing circuit board.
Figure 9:
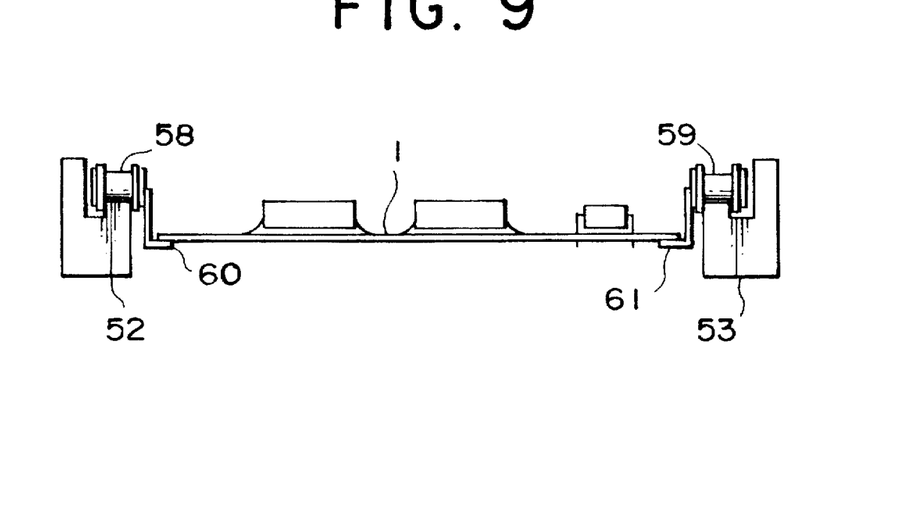
FIG. 9 is a cross-sectional view taken along the line X—X in FIG. 8, showing a feeding device for the parts disassembling apparatus for a parts mounting printing circuit board shown in FIG. 8.
Figure 10:
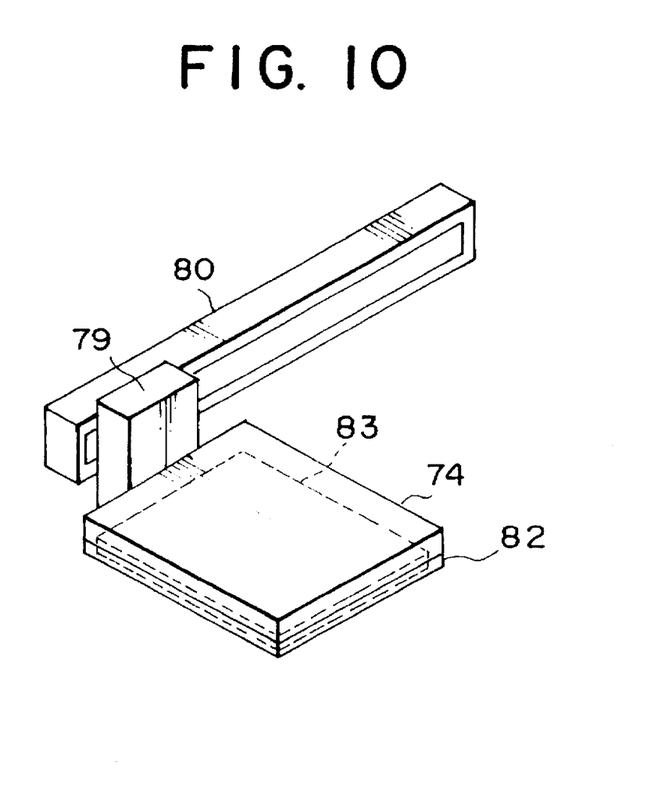
FIG. 10 is a perspective view showing another suction member.

Another embodiment of this invention will now be described with reference to FIGS. 8 through 10. FIG. 8 shows the outline of this embodiment, FIG. 9 is a cross-sectional view along the line X—X in FIG. 8, and FIG. 10 shows a modification of a suction section 72 shown in FIG. 8.

This embodiment is a parts disassembling apparatus for a parts mounting printing circuit board which is characterized by including a feeding device which feeds a conveyor chain for supporting a printed wiring board with parts mounted thereon, from below the peripheral edge of the printed wiring board, a heating furnace for heating the printed wiring board, on which parts provided on the feeding path are mounted, at a temperature equal to or higher than the melting temperature of solder, a vibration section, incorporated in the heating furnace, for applying vibration for disassembling parts, via a conveyor chain, to the parts mounting printing circuit board heated by the heating furnace, a suction section, located above the vibration section, for sucking electronic parts disassembled by the vibration section, and a handler for moving the suction section up or down to the position to contact the surface of the parts mounting printing circuit board from above the parts mounting printing circuit board and moving the suction section forward or backward to the position of a parts collecting stage provided outside the heating furnace.

A parts disassembling apparatus for a parts mounting printing circuit board 1 shown in FIG. 8 comprises a feeding device 51, which includes conveyor chains 58 and 59 for feeding the parts mounting printing circuit board 1 shown in FIG. 2, fixed guide rails 52 and 53, movable guide rails 54 and 55, and fixed guide rails 56 and 57 for guiding those conveyor chains 58 and 59, and a feeding electric motor (not shown), a heating furnace 62 with a tunnel furnace structure, so provided as to cover some of the feeding path of the conveyor chains 58 and 59, for raising the environmental temperature to a temperature equal to or higher than the melting temperature of solder, a vibration section 68, incorporated in the heating furnace 62, for continuously applying mechanical vibration to the parts mounting printing circuit board 1, a suction section 72, located above the vibration section 68, for sucking electronic parts 5 disassembled by the vibration section 68, an up and down mechanism 79 for moving the suction section 72 up or down to the position to contact the surface of the printing circuit board 1 with the mounted electronic parts 5, from above the printing circuit board 1, and a slide mechanism 80 for moving the suction section 72 forward or backward to the position of a parts collecting stage 81 provided outside the heating furnace 62.

The conveyor chains 58 and 59 are each constituted of numerous chains made of a heat-resistive material, and are towed in the direction of an arrow A at a speed of about 1 m/sec by the unillustrated feeding electric motor. As shown in FIG. 9, a plurality of support claws 60 and 61 for supporting peripheral edges 3 and 4 of two sides of the parts mounting printing circuit board 1 are provided on the inner surfaces of the conveyor chains 58 and 59. The distance between the opposing support claws 60 and 61 is so set that the parts mounting printing circuit board 1 is supported from below and does not fall off.

The heating furnace 62 has an inlet window 65 and an outlet window 66 provided on both sides, through which the conveyor chains 58 and 59 and the fixed guide rails 52 and 54 are to be inserted and the parts mounting printing circuit board 1 supported by the support claws 60 and 61 can pass, and further has a handler outlet window 67 formed on the rear side, through which the suction section 72, the up and down mechanism 79 and the slide mechanism 80 can pass. An upper infrared heater 63 and a lower infrared heater 64 are provided as heating sources respective at the upper and lower portions of the heating furnace 62 and inside thereof, and control the environmental temperature inside the furnace to 190° to 250° C. by the function of a heater control section (not shown).

The vibration section 68 causes a vertical vibrator 69 and a horizontal vibrator 70 to apply vibration to the parts mounting printing circuit board 1 from the planar direction and the thickness direction thereof via a vibration plate 71, the movable guide rails 54 and 55 and the conveyor chains 58 and 59.

The suction section 72 has, at a lower side, a suction plate 73 which has substantially the same surface area as the parts mounting printing circuit board 1 and made of a porous material and which is coupled to a vacuum valve 76 and a vacuum generator 78, both externally provided, by means of tubes 75 and 77.

The suction section 72 may not be the type which employs vacuum suction force, as shown in FIG. 8, but may be of a type shown in FIG. 10, which has, at a lower side, a suction plate 82 having substantially the same surface area as the parts mounting printing circuit board 1 and having a plurality of electromagnets 83 sealed all over the plate 82, so that the electronic parts 5 having magnetic components are attracted by the magnetic force.

The perspective view of FIG. 8 shows the parts mounting printing circuit board mounted in front of the heating furnace 62.

The parts mounting printing circuit board 1 is fed, with its peripheral edges 3 and 4 placed on the support claws 60 and 61 in front of the heating furnace 62.

Thereafter, the unillustrated feeding electric motor is activated to tract the conveyor chains 58 and 59 to thereby keep supplying the parts mounting printing circuit board 1 into the heating furnace 62 via the inlet window 65 of the heating furnace 62. When the parts mounting printing circuit board comes to the position of the vibration section 68, the feeding device 51 is deactivated. The deactivation time has previously been set to a predetermined time enough for the parts mounting printing circuit board 1 to be heated up by the environmental temperature of the heating furnace 62 and the upper infrared heater 63 and the lower infrared heater 64 so that the soldered portions of the electronic parts 5 become molten state. This predetermined time includes a marginal time.

After the predetermined deactivation time passes, the vertical vibrator 69 and the horizontal vibrator 70 are activated for a predetermined time to continuously vibrate the printed wiring board 1 in the vertical and horizontal directions via the vibration plate 71, the movable guide rails 54 and 55 and the conveyor chains 58 and 59. At this time, as the vertical and horizontal vibrations are continuously applied to the printed wiring board 1, the electronic parts 5 whose soldered portions are melted are separated from the printed wiring board 1. The electronic parts 5 disassembled in this process are surface-mount type parts, parts of a through-hole type and the like, and the time needed for this process is about several tens of seconds.

Then, the slide mechanism 80 is activated to move the suction plate 73 to above the vibration section 68 from the position of the parts collecting stage 81. Next, the up and down mechanism 79 is activated to lower the suction plate 73 so that the bottom of the suction plate 73 comes in contact with the surface of the parts mounting printing circuit board 1. Then, the vacuum generator 78 is activated to set the vacuum valve 76 to the "open" state. At this time, the electronic parts 5 disassembled from the printed wiring board 1 in the previous process are attracted to the bottom of the suction plate 73 by the vacuum attraction force produced from the bottom of the suction plate 73.

Then, the up and down mechanism 79 is activated to raise the suction plate 73 and the slide mechanism 80 is activated to move the suction plate 73 to the position of the parts collecting stage 81 from above the vibration section 68. Next, the up and down mechanism 79 is activated to lower the suction plate 73 and the vacuum generator 78 is deactivated to set the vacuum valve 76 to the "close" state. At this time, the vacuum attraction force produced from the bottom of the suction plate 73 disappears, leaving the electronic parts 5 on the parts collecting stage 81.

Subsequently, the feeding electric motor (not shown) is activated to tract the conveyor chains 58 and 59 so that the printed wiring board 1, from which the electronic parts 5 have been disassembled, are fed out of the heating furnace 62 through the outlet window 66.

Thereafter, the printed wiring board 1 is removed from the conveyor chains 58 and 59.

What is claimed is:

1. A parts disassembling apparatus comprising:

a heating furnace for heating a printed wiring board with parts mounted thereon by solder, to a temperature equal to or higher than a melting temperature of said solder;

a plurality of printed wiring board carriers for holding outer circumferential edge portions of said printed wiring board;

feeding means for connecting a plurality of said printed wiring board carriers and sequentially introducing said printed wiring board carriers into said heating furnace;

a parts disassembling member for exerting an impact or vibration force repeatedly on the printed wiring board;

a primary fixing portion opening and closing mechanism for making said printed wiring board carriers grip an outer circumference of said printed wiring board before feeding said printed wiring board carriers into said heating furnace;

a secondary fixing portion opening and closing mechanism for releasing the gripping of said printed wiring board by said printed wiring board carriers fed out of said heating furnace; and wherein said parts disassembling member is provided on an external surface of a rotary body.

2. A parts disassembling apparatus comprising:

a heating furnace for heating a printed wiring board with parts mounted thereon by solder, to a temperature equal to or higher than a melting temperature of said solder;

a plurality of printed wiring board carriers for holding outer circumferential edge portions of said printed wiring board;

feeding means for connecting a plurality of said printed wiring board carriers and sequentially introducing said printed wiring board carriers into said heating furnace;

a parts disassembling member for exerting an impact or vibration force repeatedly on the printed wiring board;

a primary fixing portion opening and closing mechanism for making said printed wiring board carriers grip an outer circumference of said printed wiring board before feeding said printed wiring board carriers into said heating furnace; and a secondary fixing portion opening and closing mechanism for releasing the gripping of said printed wiring board by said printed wiring board carriers fed out of said heating furnace.

3. A parts disassembling apparatus comprising:

a heating furnace for heating a printed wiring board with parts mounted thereon by solder, to a temperature equal to or higher than a melting temperature of said solder;

a plurality of printed wiring board carriers for holding outer circumferential edge portions of said printed wiring board;

feeding means for connecting a plurality of said printed wiring board carriers and sequentially introducing said printed wiring board carriers into said heating furnace;

a parts disassembling member for exerting a shearing force between said parts and said printed wiring board by scraping a parts mounting surface on said printed wiring board;

a primary fixing portion opening and closing mechanism for making said printed wiring board carriers grip an outer circumference of said printed wiring board before feeding said printed wiring board carriers into said heating furnace; and a secondary fixing portion opening and closing mechanism for releasing the gripping of said printed wiring board by said printed wiring board carriers fed out of said heating furnace.

4. A parts disassembling apparatus as set forth in claim 3, wherein said parts disassembling member is provided on an external surface of a rotary body.

* * * * *